(12) United States Patent
Nishizawa et al.

(10) Patent No.: US 10,897,226 B2
(45) Date of Patent: *Jan. 19, 2021

(54) OSCILLATOR, ELECTRONIC DEVICE, AND VEHICLE

(71) Applicant: SEIKO EPSON CORPORATION, Tokyo (JP)

(72) Inventors: Ryuta Nishizawa, Nagano (JP); Shinya Aoki, Minowa-machi (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/796,721

(22) Filed: Feb. 20, 2020

(65) Prior Publication Data

US 2020/0274492 A1   Aug. 27, 2020

(30) Foreign Application Priority Data

Feb. 22, 2019   (JP) .................................. 2019-031049

(51) Int. Cl.
*G01N 27/00* (2006.01)
*G08B 19/00* (2006.01)
(Continued)

(52) U.S. Cl.
CPC ............. *H03B 5/32* (2013.01); *B60R 16/023* (2013.01); *H03B 5/04* (2013.01);
(Continued)

(58) Field of Classification Search
CPC .... H03B 5/32; H03B 5/04; H03B 2200/0018; B60R 16/023; H03L 7/0992; H03L 7/085
(Continued)

(56) References Cited

U.S. PATENT DOCUMENTS 7,782,147 B2 * 8/2010 Anderson .................. H03L 1/04
331/158
8,299,864 B2 * 10/2012 Tanaka ..................... H03L 1/022
331/116 R
(Continued)

FOREIGN PATENT DOCUMENTS

JP   2005-286892   10/2005
JP   2014-103627    6/2014
(Continued)

*Primary Examiner* — Richard Tan
(74) *Attorney, Agent, or Firm* — Workman Nydegger (57) ABSTRACT

An oscillator includes a first container that includes a first base substrate and a first lid bonded to the first base substrate and has a first internal space, a second container that is accommodated in the first internal space and fixed to the first base substrate, a resonator element that is accommodated in the second container, a temperature sensor that is accommodated in the second container, a first circuit element that is accommodated in the second container and includes an oscillation circuit oscillating the resonator element and generating an oscillation signal on which temperature compensation is performed based on a detected temperature of the temperature sensor, and a second circuit element that is fixed to the first base substrate and includes a frequency control circuit that controls a frequency of the oscillation signal, in which the second container and the second circuit element are arranged side by side in plan view.

10 Claims, 8 Drawing Sheets

(51) Int. Cl.
  G08B 21/00 (2006.01)
  H03B 5/32 (2006.01)
  H03B 5/04 (2006.01)
  B60R 16/023 (2006.01)
  H03L 7/099 (2006.01)
  H03L 7/085 (2006.01)

(52) U.S. Cl.
  CPC ...... *H03B 2200/0018* (2013.01); *H03L 7/085* (2013.01); *H03L 7/0992* (2013.01)

(58) Field of Classification Search
  USPC .......................................................... 331/66
  See application file for complete search history.

(56) References Cited

U.S. PATENT DOCUMENTS

| | | | |
|---|---|---|---|
| 8,941,444 B2* | 1/2015 | Asamura | H03B 5/364 331/108 C |
| 9,685,889 B2* | 6/2017 | Horie | H02N 2/001 |
| 2014/0152392 A1 | 6/2014 | Owaki et al. | |
| 2017/0141727 A1* | 5/2017 | Fukuzawa | H03L 1/00 |
| 2017/0272082 A1* | 9/2017 | Obata | H03B 1/02 |
| 2017/0272083 A1 | 9/2017 | Owaki et al. | |
| 2018/0198408 A1 | 7/2018 | Owaki et al. | |
| 2018/0269832 A1 | 9/2018 | Obata | |
| 2018/0278209 A1 | 9/2018 | Obata et al. | |

FOREIGN PATENT DOCUMENTS

| | | |
|---|---|---|
| JP | 2014-107862 | 6/2014 |
| JP | 2017-175202 | 9/2017 |
| JP | 2017-175203 | 9/2017 |
| JP | 2018-113603 | 7/2018 |
| JP | 2018-142899 | 9/2018 |
| JP | 2018-157377 | 10/2018 |
| JP | 2018-160892 | 10/2018 |

* cited by examiner

OSCILLATOR, ELECTRONIC DEVICE, AND VEHICLE

The present application is based on, and claims priority from JP Application Serial Number 2019-031049, filed Feb. 22, 2019, the disclosure of which is hereby incorporated by reference herein in its entirety.

BACKGROUND

1. Technical Field

The present disclosure relates to an oscillator, an electronic device, and a vehicle.

2. Related Art

JP-A-2014-107862 discloses an oscillator including an outer package, an inner package accommodated in the outer package, a resonator element accommodated in the inner package, and circuit elements accommodated in the outer package and arranged side by side with the inner package in plan view. In the oscillator of JP-A-2014-107862, the circuit element includes a temperature sensor, and the frequency of an output signal is corrected based on the temperature detected by the temperature sensor.

However, in the oscillator of JP-A-2014-107862, since the circuit element including the temperature sensor is located outside the inner package that accommodates the resonator element, a temperature difference between the temperature sensor and the resonator element is likely to occur, and it is difficult to correct the output signal with high accuracy. As a result, the frequency accuracy of the output signal may be reduced.

SUMMARY

An oscillator according to an aspect of the present disclosure includes a first container that includes a first base substrate and a first lid bonded to the first base substrate and has a first internal space, a second container that is accommodated in the first internal space and fixed to the first base substrate, a resonator element that is accommodated in the second container, a temperature sensor that is accommodated in the second container, a first circuit element that is accommodated in the second container and includes an oscillation circuit oscillating the resonator element and generating an oscillation signal on which temperature compensation is performed based on a detected temperature of the temperature sensor, and a second circuit element that is fixed to the first base substrate and includes a frequency control circuit that controls a frequency of the oscillation signal, in which the second container and the second circuit element are arranged side by side in plan view.

In the oscillator according to the application example of the disclosure, the first base substrate may include a first portion and a second portion thicker than the first portion, the second container may be fixed to one of the first portion and the second portion, and the second circuit element may be fixed to the other thereof.

In the oscillator according to the application example of the disclosure, a thinner one of the second container and the second circuit element may be fixed to the second portion, and a thicker one may be fixed to the first portion.

In the oscillator according to the application example of the disclosure, the second container may include a temperature output terminal from which an output signal of the temperature sensor is output, and the temperature output terminal may be electrically coupled to the frequency control circuit.

In the oscillator according to the application example of the disclosure, the second container may include a power supply terminal to which a power supply voltage supplied to the oscillation circuit is applied, and the oscillator may further include a bypass capacitor that is accommodated in the first container, and is coupled to the power supply terminal.

The oscillator according to the application example of the disclosure may further include a first bypass capacitor and a second bypass capacitor that are accommodated in the first container and are fixed to the first base substrate, in which one end of the first bypass capacitor and one end of the second bypass capacitor may be disposed to face each other, and end portions on facing sides of the first bypass capacitor and the second bypass capacitor may have the same potential.

In the oscillator according to the application example of the disclosure, the second container may be fixed to the first base substrate via an insulating bonding member.

In the oscillator according to the application example of the disclosure, the second container may include a first side and a second side closer to the second circuit element than the first side in plan view, and an oscillation output terminal from which the oscillation signal is output, and the oscillation output terminal may be provided at one of two corners located at both ends of the second side.

In the oscillator according to the application example of the disclosure, the second container may include a second base substrate and a second lid bonded to the second base substrate and have a second internal space, in which the resonator element and the first circuit element may be accommodated, and the second lid may be fixed to the first base substrate.

An electronic device according to an application example of the disclosure includes the oscillator described above and a signal processing circuit that performs signal processing based on an output signal of the oscillator.

A vehicle according to an application example of the disclosure includes the oscillator described above and a signal processing circuit that performs signal processing based on an output signal of the oscillator.

DESCRIPTION OF EXEMPLARY EMBODIMENTS

Hereinafter, preferred embodiments of an oscillator, an electronic device, and a vehicle according to the disclosure will be described in detail with reference to the accompanying drawings.

First Embodiment

Figure 1:
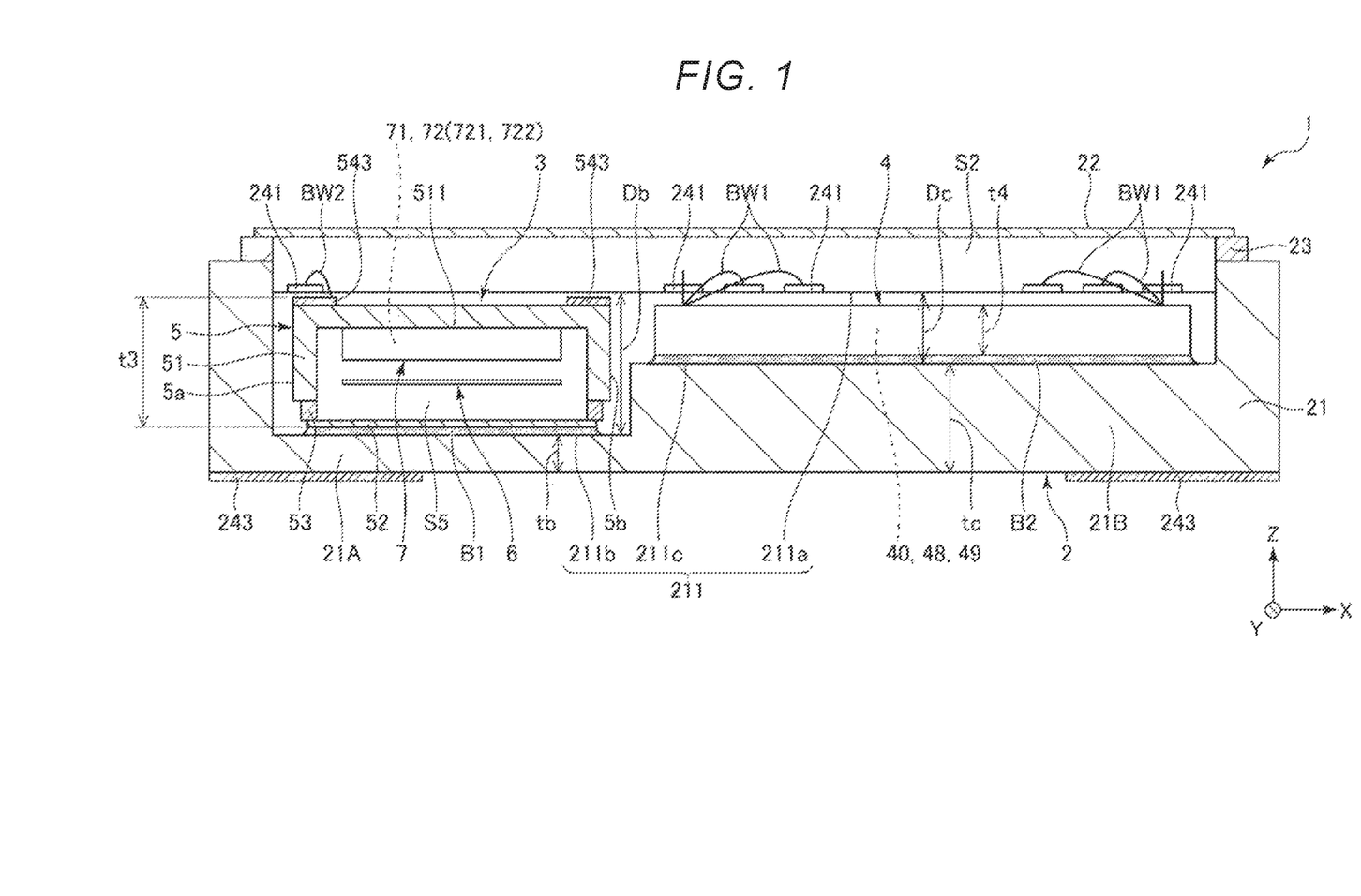
FIG. 1 is a cross-sectional view showing an oscillator according to a first embodiment.
Figure 2:
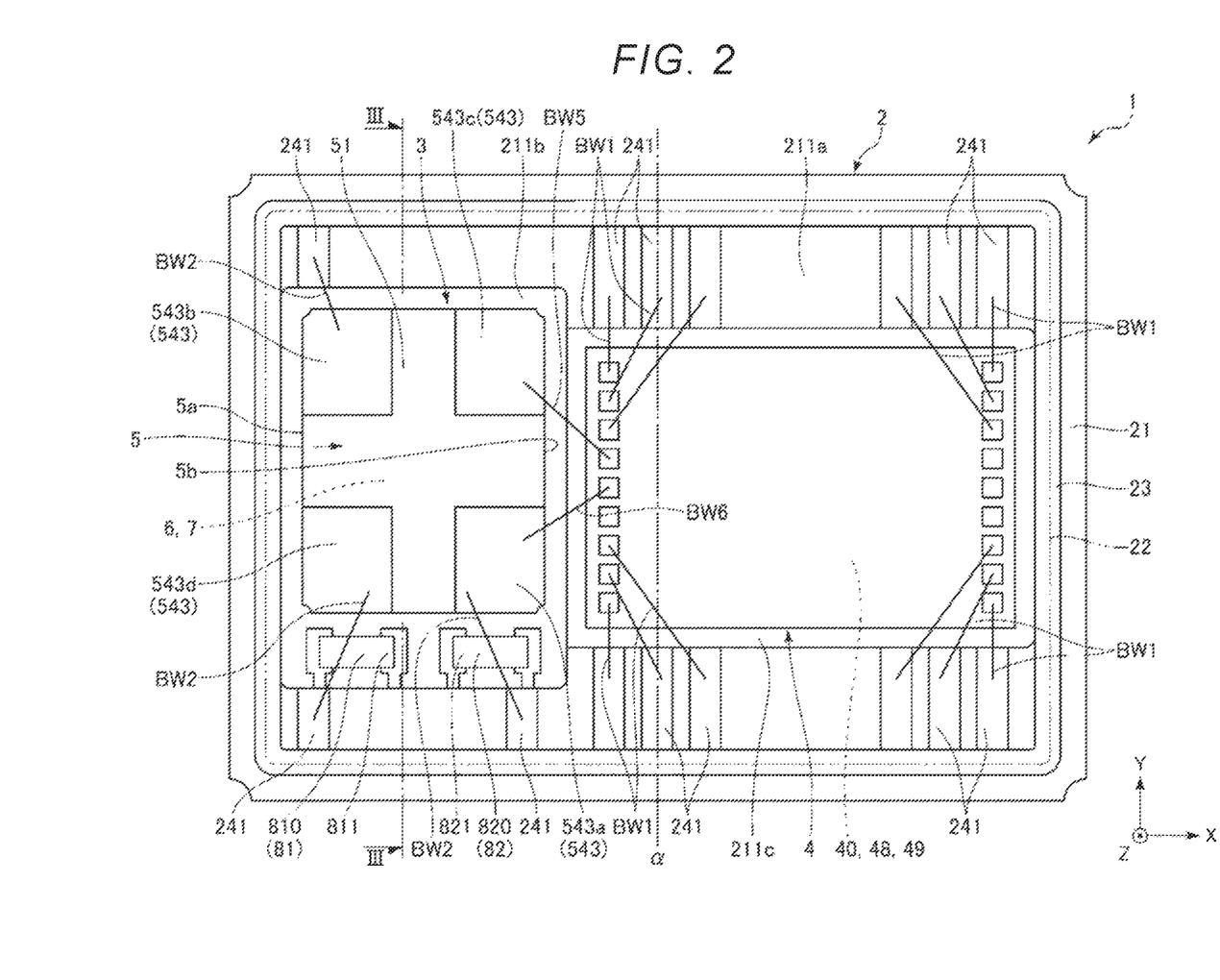
FIG. 2 is a plan view showing the oscillator of FIG. 1.
Figure 3:
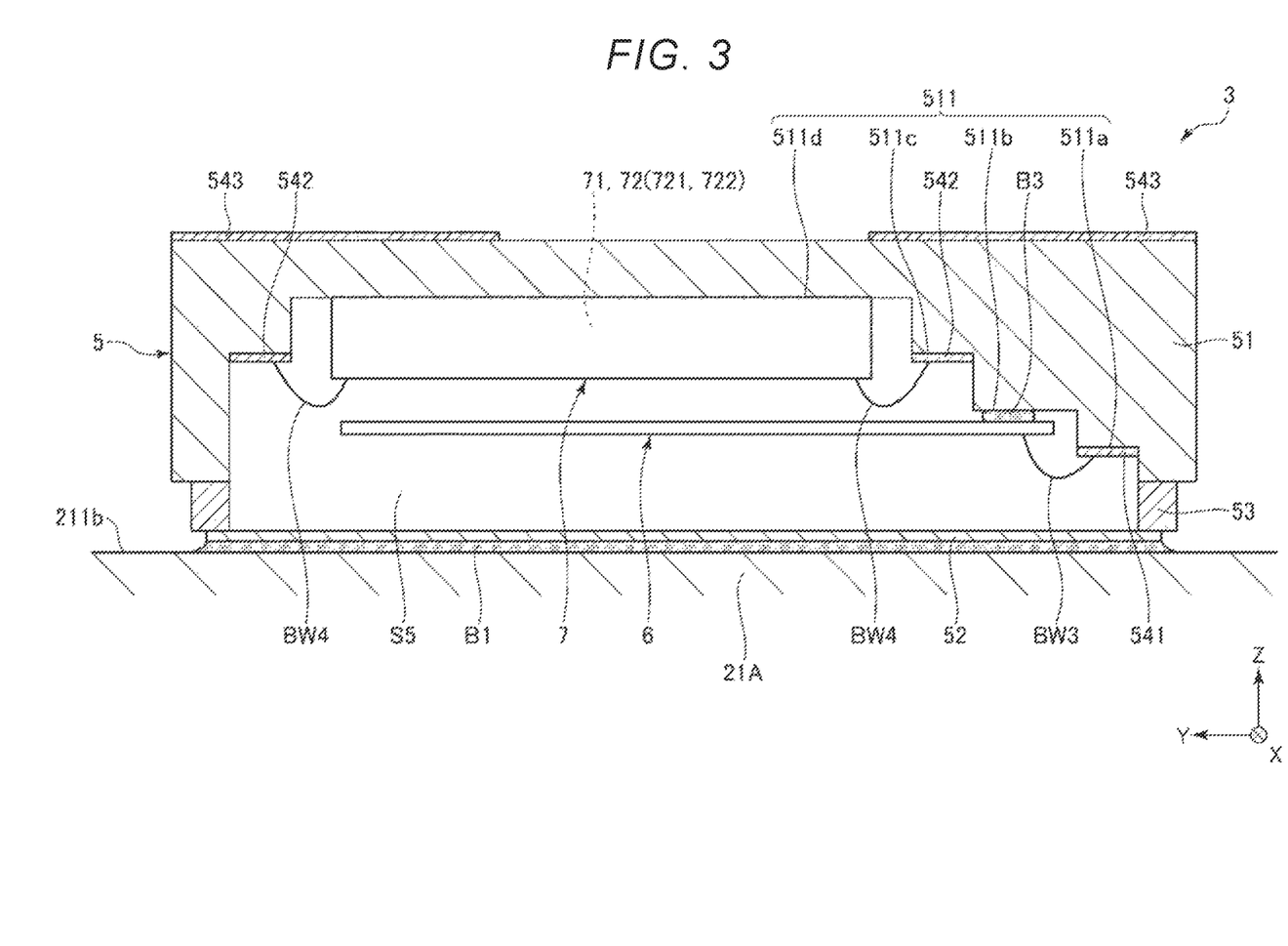
FIG. 3 is a cross-sectional view taken along line III-III in FIG. 2.
Figure 4:
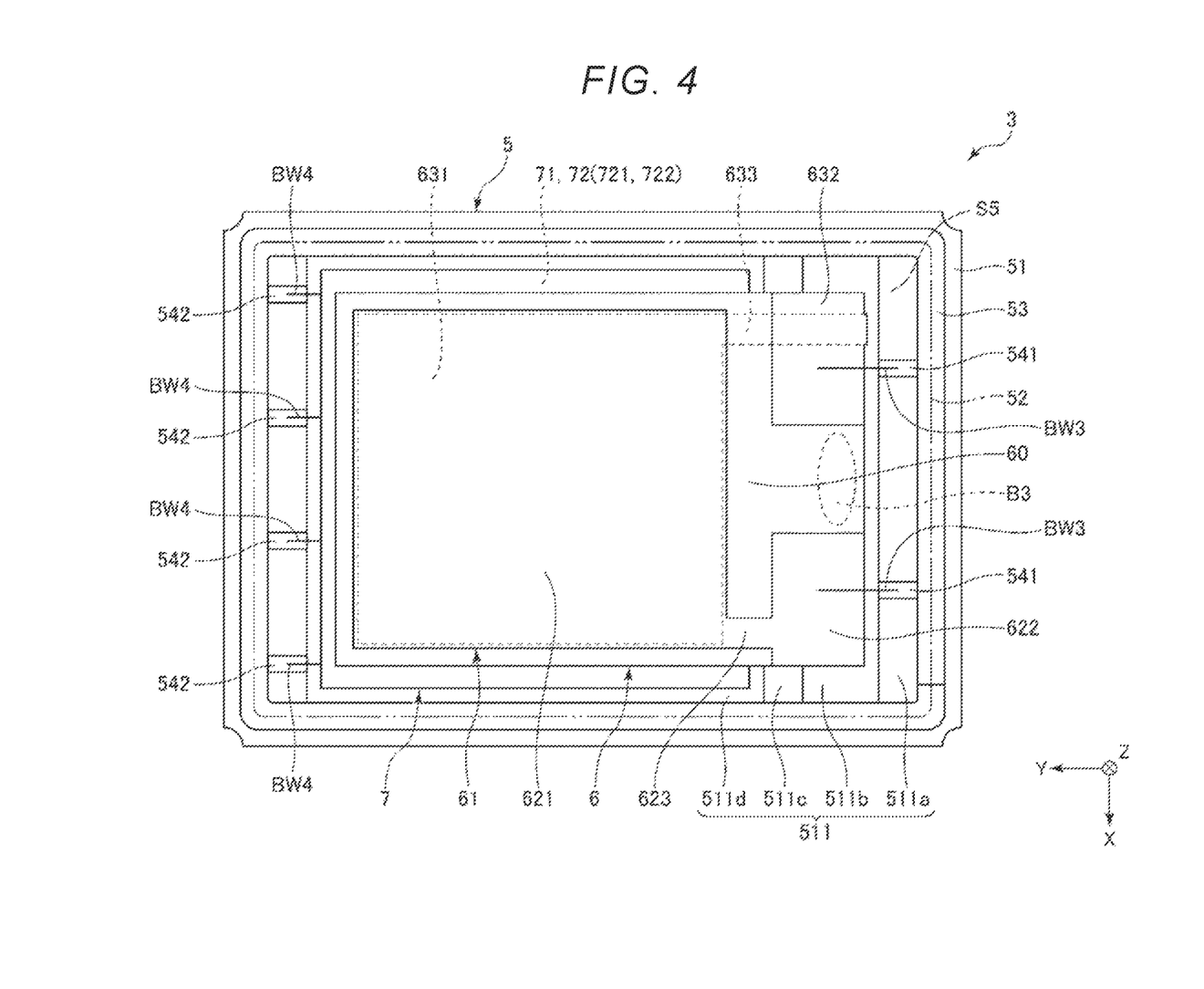
FIG. 4 is a plan view of a temperature compensated crystal oscillator included in the oscillator of FIG. 1 as viewed from below.
Figure 5:
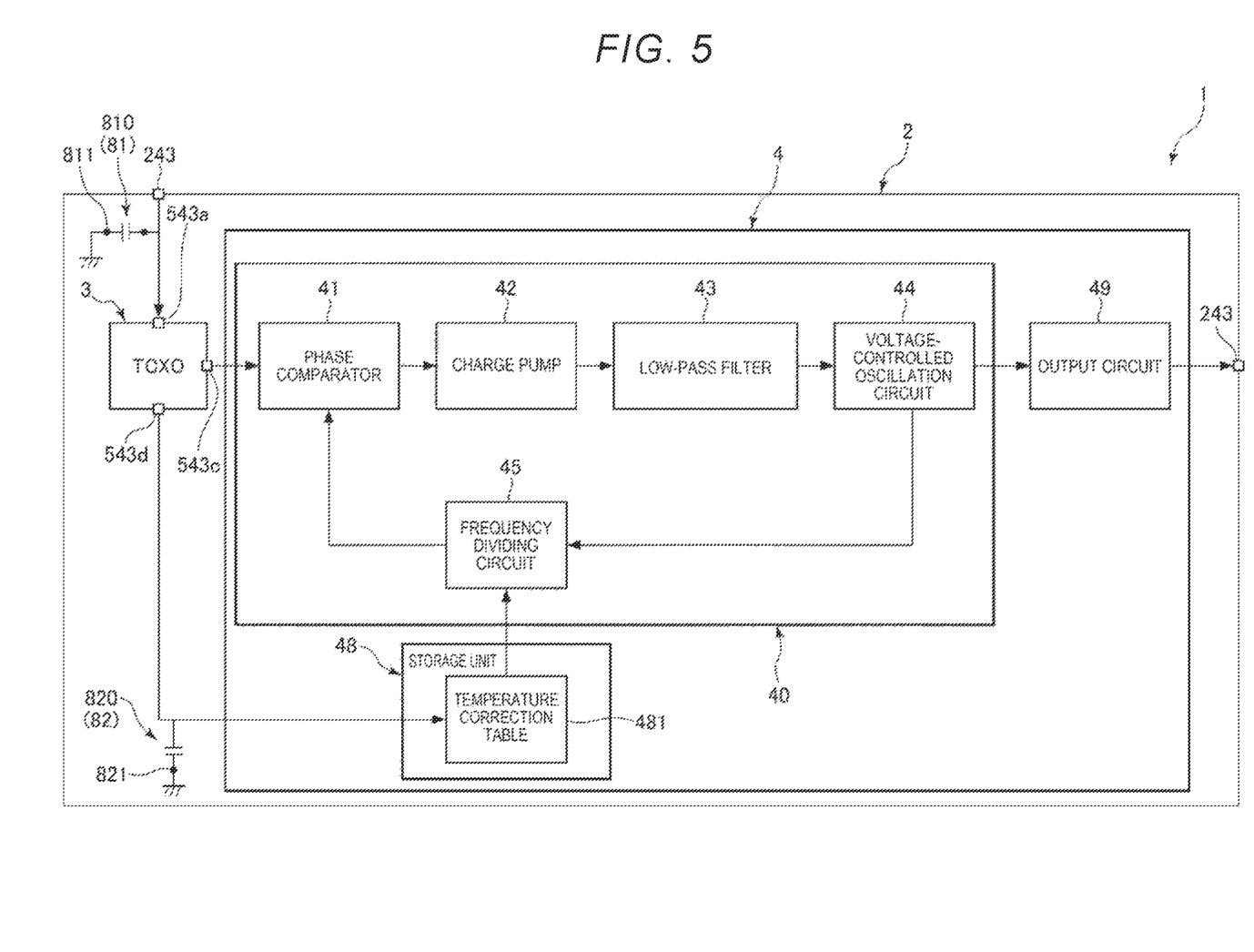
FIG. 5 is a circuit view of a second circuit element included in the oscillator of FIG. 1.

FIG. 1 is a cross-sectional view showing an oscillator according to a first embodiment. FIG. 2 is a plan view showing the oscillator of FIG. 1. FIG. 3 is a cross-sectional view taken along line III-III in FIG. 2. FIG. 4 is a plan view of a temperature compensated crystal oscillator included in the oscillator of FIG. 1 as viewed from below. FIG. 5 is a circuit view of a second circuit element included in the oscillator of FIG. 1. For convenience of description, each figure shows an X axis, a Y axis, and a Z axis that are orthogonal to each other. In the following, the arrow tip side of each axis is referred to as "plus", and the opposite side is referred to as "minus". The Z-axis direction plus side is also referred to as "upper", and the Z-axis direction minus side is also referred to as "lower". The plan view from the Z-axis direction is also simply referred to as "plan view".

The oscillator 1 shown in FIGS. 1 and 2 includes an outer package 2, a temperature compensated crystal oscillator 3 (TCXO) accommodated in the outer package 2, a second circuit element 4, and discrete components 81 and 82. The temperature compensated crystal oscillator 3 includes an inner package 5, a resonator element 6 and a first circuit element 7 accommodated in the inner package 5.

The outer package 2 includes a first base substrate 21 having a recess portion 211 that opens on the upper surface, and a first lid 22 that is bonded to the upper surface of the first base substrate 21 via a bonding member 23 so as to close the opening of the recess portion 211. An airtight first internal space S2 is formed inside the outer package 2 by the recess portion 211, and the temperature compensated crystal oscillator 3 and the first circuit element 7 are housed in the first internal space S2. Although not particularly limited, the first base substrate 21 can be made of ceramics such as alumina, and the first lid 22 can be made of a metal material such as Kovar.

The recess portion 211 is constituted by a plurality of recess portions. In the configuration shown in the drawing, the recess portion 211 includes a recess portion 211a that opens on the upper surface of the first base substrate 21, and a recess portion 211b and a recess portion 211c that open on the bottom surface of the recess portion 211a and have a smaller opening than the recess portion 211a. The recess portions 211b and 211c are formed side by side in the X-axis direction, and a depth Db of the recess portion 211b is greater than a depth Dc of the recess portion 211c. Therefore, the bottom surface of the recess portion 211b is located below the bottom surface of the recess portion 211c. A thickness tb of the portion of the first base substrate 21 that overlaps the recess portion 211b is smaller than a thickness tc of the portion that overlaps the recess portion 211c. Hereinafter, the portion of the first base substrate 21 overlapping the recess portion 211b is also referred to as "thin portion 21A", and the portion of the first base substrate 21 overlapping the recess portion 211c is also referred to as "thick portion 21B". However, the configuration of the recess portion 211 is not particularly limited.

The second circuit element 4 is fixed to the bottom surface of the recess portion 211c, and the temperature compensated crystal oscillator 3 is fixed to the bottom surface of the recess portion 211b. As shown in FIG. 2, two discrete components 81 and 82, which are single circuit components, are fixed to the bottom surface of the recess portion 211b so as not to overlap the temperature compensated crystal oscillator 3. According to such an arrangement, the second circuit element 4, the temperature compensated crystal oscillator 3, and each discrete component 81 and 82 can be arranged in the X-axis direction and the Y-axis direction without overlapping in the Z-axis direction in plan view. Therefore, the height of the outer package 2 can be reduced.

Further, as shown in FIG. 1, a plurality of internal terminals 241 are arranged on the bottom surface of the recess portion 211a, and a plurality of external terminals 243 are arranged on the bottom surface of the first base substrate 21. These internal terminals 241 or the internal terminals 241 and the external terminals 243 are electrically coupled via a wiring (not shown) formed in the first base substrate 21. Some internal terminals 241 are electrically coupled to the second circuit element 4 through bonding wires BW1, and some internal terminals 241 are electrically coupled to the temperature compensated crystal oscillator 3 through bonding wires BW2.

The atmosphere of the first internal space S2 is not particularly limited, but for example, may be a reduced pressure state, particularly a vacuum state, which is replaced with an inert gas such as nitrogen or argon and reduced in pressure relative to the atmospheric pressure. Thereby, the heat-insulating property of the outer package 2 is enhanced, and the oscillator 1 is hardly affected by the external temperature. Further, heat exchange between the inner package 5 accommodated in the outer package 2 and the second circuit element 4, particularly heat exchange by convection is suppressed. Therefore, it is possible to prevent a temperature sensor 71 and the resonator element 6 included in the first circuit element 7 from being heated unevenly by the heat of the second circuit element 4. That is, it is possible to suppress the occurrence of a temperature difference between the resonator element 6 and the temperature sensor 71 due to the heat of the second circuit element 4. Therefore, the temperature sensor 71 can accurately detect the temperature of the resonator element 6, and the highly accurate oscillator 1 can be obtained.

The atmosphere of the first internal space S2 is not limited thereto, and may be, for example, an atmospheric pressure state or a pressurized state. The first internal space S2 may not be replaced with an inert gas such as nitrogen or argon, but may be filled with atmosphere, that is, air. The first internal space S2 may not be airtight but may communicate with the outside of the outer package 2.

As shown in FIG. 3, the temperature compensated crystal oscillator 3 includes an inner package 5, a resonator element 6 and a first circuit element 7 accommodated in the inner package 5. The inner package 5 includes a second base substrate 51 having a recess portion 511 that opens on the lower surface, and a second lid 52 bonded to the lower surface of the second base substrate 51 via a bonding member 53 so as to close the opening of the recess portion 511. An airtight second internal space S5 is formed in the inner package 5 by the recess portion 511, and the resonator element 6 and the first circuit element 7 are accommodated in the second internal space S5. Although not particularly limited, the second base substrate 51 can be made of ceramics such as alumina, and the second lid 52 can be made of a metal material such as Kovar.

The recess portion 511 is constituted by a plurality of recess portions, and includes a recess portion 511a that opens on the lower surface of second base substrate 51, a recess portion 511b that opens on the bottom surface of the recess portion 511a and has a smaller opening than the recess portion 511a, a recess portion 511c that opens on the bottom surface of the recess portion 511b and has a smaller opening than the recess portion 511b, and a recess portion 511d that opens on the bottom surface of the recess portion 511c and has a smaller opening than the recess portion 511c, as shown in FIG. 4. However, the configuration of the recess portion 511 is not particularly limited.

The resonator element 6 is fixed to the bottom surface of the recess portion 511b, and the first circuit element 7 is fixed to the bottom surface of the recess portion 511d. According to such an arrangement, the resonator element 6 and the first circuit element 7 can be arranged in the Z-axis direction, that is, in the height direction of the oscillator 1 in the inner package 5. Therefore, these can be accommodated in the inner package 5 in a compact manner, and the size of the temperature compensated crystal oscillator 3 can be reduced. The arrangement of the resonator element 6 is not limited thereto and may be fixed to the upper surface of the first circuit element 7, for example.

A plurality of internal terminals 541 are disposed on the bottom surface of the recess portion 511a, a plurality of internal terminals 542 are disposed on the bottom surface of the recess portion 511c, and a plurality of external terminals 543 are disposed on the upper surface of the second base substrate 51. The internal terminals 541 and 542 and the external terminal 543 are electrically coupled via a wiring (not shown) formed in the second base substrate 51. Each of the plurality of internal terminals 541 is electrically coupled to the resonator element 6 via a bonding wire BW3, and each of the plurality of internal terminals 542 is electrically coupled to the first circuit element 7 via a bonding wire BW4. However, the connection method between the resonator element 6 and the internal terminal 541 and the connection method between the first circuit element 7 and the internal terminal 542 are not particularly limited.

The atmosphere of the second internal space S5 is not particularly limited, but for example, is preferably a reduced pressure state, particularly a vacuum state, which is replaced with an inert gas such as nitrogen or argon and reduced in pressure relative to the atmospheric pressure. Thereby, viscous resistance decreases and the resonator element 6 can be vibrated efficiently. However, the atmosphere of the second internal space S5 is not limited thereto, and may be an atmospheric pressure state or a pressurized state.
Accordingly, heat transfer due to convection is likely to occur in the second internal space S5, the temperature difference between the resonator element 6 and the temperature sensor 71 can be further reduced, and the temperature sensor 71 detects the temperature of the resonator element 6 with accuracy. The second internal space S5 may not be replaced with an inert gas such as nitrogen or argon, but may be filled with atmosphere, that is, air. Further, the second internal space S5 is not airtight and may communicate with the first internal space S2.

The resonator element 6 is an AT cut quartz crystal resonator element. Since the AT cut quartz crystal resonator element has a third-order frequency temperature characteristic, the resonator element 6 has excellent frequency stability. As shown in FIG. 4, the resonator element 6 includes a rectangular quartz crystal substrate 60 cut out by AT cut, and an electrode 61 disposed on the surface of the quartz crystal substrate 60. The electrode 61 includes a first excitation electrode 621 disposed on the lower surface of the quartz crystal substrate 60 and a second excitation electrode 631 disposed on the upper surface of the quartz crystal substrate 60 and facing a first excitation electrode 621 through the quartz crystal substrate 60. In addition, the electrode 61 includes a first pad electrode 622 and a second pad electrode 632 which are arranged on the lower surface of the quartz crystal substrate 60 and aligned with the edge thereof, a first extraction electrode 623 that electrically couples the first excitation electrode 621 and the first pad electrode 622, and a second extraction electrode 633 that electrically couples the second excitation electrode 631 and the second pad electrode 632.

Such a resonator element 6 is bonded to the bottom surface of the recess portion 511b via a bonding member B3 at one end thereof. The first pad electrode 622 and the second pad electrode 632 are each electrically coupled with the internal terminal 541 via the bonding wire BW3. Each of the first pad electrode 622 and the second pad electrode 632 may be electrically coupled to the inner package 5 via a conductive adhesive instead of via a bonding wire. The bonding member B3 is not particularly limited, may be, for example, a conductive bonding member typified by a metal bump, solder, a brazing material, a metal paste, and a conductive resin adhesive, or may be an insulating bonding member typified by various resin adhesives such as epoxy, silicone, and polyimide, but is preferably a conductive bonding member.

Since the conductive bonding member includes a metal material, the conductive bonding member has a higher thermal conductivity than an insulating bonding member that does not include a metal material typified by a resin adhesive. Therefore, the resonator element 6 and the first circuit element 7 are easily thermally coupled via the bonding member B3 and the second base substrate 51, and the temperature difference therebetween can be further reduced. Therefore, the temperature sensor 71 can accurately detect the temperature of the resonator element 6.

However, the configuration of the resonator element 6 is not particularly limited. For example, the plan view shape of the quartz crystal substrate 60 is not limited to a rectangle. As the resonator element 6, in addition to the AT-cut crystal resonator element, an SC-cut crystal resonator element, a BT-cut crystal resonator element, a tuning fork crystal resonator element, a surface acoustic wave resonator, other piezoelectric resonator elements, and a micro electro mechanical system (MEMS) resonator element can also be used.

Further, in place of the quartz crystal substrate 60, various piezoelectric substrates such as lithium niobate ($LiNbO_3$), lithium tantalate ($LiTaO_3$), lead zirconate titanate (PZT), lithium tetraborate ($Li_2B_4O_7$), langasite ($La_3Ga_5SiO_{14}$), potassium niobate ($KNbO_3$), gallium phosphate ($GaPO_4$), gallium arsenide (GaAs), aluminum nitride (AlN), zinc oxide (ZnO, $Zn_2O_3$), barium titanate ($BaTiO_3$), lead titanate ($PbPO_3$), sodium potassium niobate ((K, Na)$NbO_3$), bismuth ferrite ($BiFeO_3$), sodium niobate ($NaNbO_3$), bismuth titanate ($Bi_4Ti_3O_{12}$), bismuth sodium titanate ($Na_{0.5}Bi_{0.5}TiO_3$), and the like may be used, or for example, a substrate other than the piezoelectric substrates, such as a silicon substrate may also be used.

As shown in FIG. 3, the first circuit element 7 includes a temperature sensor 71 and an oscillation circuit 72. The oscillation circuit 72 has a function of causing the resonator element 6 to oscillate and generating an oscillation signal of which temperature is compensated based on the temperature detected by the temperature sensor 71. In other words, the oscillation circuit 72 includes an oscillation circuit unit 721 that is electrically coupled to the resonator element 6, amplifies the output signal of the resonator element 6, and oscillates the resonator element 6 by feeding back the amplified signal to the resonator element 6, and a temperature compensation circuit unit 722 that performs temperature compensation so that the frequency variation of the output signal is smaller than the frequency temperature characteristic of the resonator element 6 itself, based on the temperature information output from the temperature sensor 71. As the oscillation circuit 72, for example, an oscillation circuit such as a Pierce oscillation circuit, an inverter type oscillation circuit, a Colpitts oscillation circuit, a Hartley oscillation circuit, or the like can be used. For example, the temperature compensation circuit unit 722 included in the oscillation circuit 72 may adjust the oscillation frequency of the oscillation circuit unit 721 by adjusting the capacitance of a variable capacitance circuit coupled to the oscillation circuit unit 721 or adjust the frequency of the output signal of the oscillation circuit unit 721 by a PLL circuit or a direct digital synthesizer circuit.

Thus, by housing both the temperature sensor 71 and the resonator element 6 in the inner package 5, the temperature sensor 71 can be disposed in the same space as the resonator element 6 and in the vicinity of the resonator element 6. Therefore, the temperature sensor 71 can detect the temperature of the resonator element 6 with higher accuracy, and the temperature compensation by the oscillation circuit 72 becomes more accurate.

In the present embodiment, the temperature sensor 71 is configured by an IC temperature sensor and is built in the first circuit element 7, but is not limited thereto. That is, the temperature sensor 71 may be a discrete component provided separately from the first circuit element 7. In this case, the temperature sensor 71 can be configured by a thermistor, a thermocouple, or the like, for example. The arrangement of the temperature sensor 71 is not particularly limited as long as the temperature of the resonator element 6 can be detected in the second internal space S5. For example, the temperature sensor 71 can be disposed on the upper surface of the second base substrate 51 or the first circuit element 7.

The temperature compensated crystal oscillator 3 has been described above. The temperature compensated crystal oscillator 3 has the four external terminals 543 described above, and as shown in FIG. 2, one is a terminal 543a for power supply voltage supplied to the first circuit element 7, one is a terminal 543b for ground with respect to the power supply voltage, one is a terminal 543c for oscillation signal output from the oscillation circuit 72, and one is a terminal 543d for temperature signal output from the temperature sensor 71.

The inner package 5 includes a first side 5a that is located on the minus side in the X-axis direction and parallel to the Y-axis, and a second side 5b that is located on the plus side in the X-axis direction and parallel to the Y-axis in plan view. That is, the second side 5b is disposed closer to the second circuit element 4 than the first side 5a. The terminal 543b is located at the corner located on the Y-axis direction plus side end of the first side 5a, the terminal 543d is located at the corner located on the Y-axis direction minus side end of the first side 5a, the terminal 543c is located at the corner located at the Y-axis direction plus side end of the second side 5b, and the terminal 543a is located at the corner located at the Y-axis direction minus side end of the second side 5b. According to such an arrangement, the terminal 543c can be disposed closer to the second circuit element 4, and the wiring length between the terminal 543c and the second circuit element 4 can be shortened. Therefore, it is difficult for noise to be added to the oscillation signal output from the oscillation circuit 72, and an accurate oscillation signal can be output to the second circuit element 4. However, the number, arrangement, and application of the external terminals 543 are not particularly limited.

As shown in FIG. 1, the temperature compensated crystal oscillator 3 is disposed with the second lid 52 facing the bottom surface of the recess portion 211b, and the second lid 52 is fixed to the bottom surface of the recess portion 211b via an insulating bonding member B1. That is, the temperature compensated crystal oscillator 3 is disposed in the thin portion 21A of the first base substrate 21. By fixing the second lid 52 to the bottom surface of the recess portion 211b in this way, for example, as compared with the case where the second base substrate 51 is fixed to the bottom surface of the recess portion 211b as in a second embodiment described later, the heat transfer path from the joint portion between the inner package 5 and the first base substrate 21 to the resonator element 6 and the first circuit element 7 becomes longer. Therefore, the heat of the second circuit element 4 is difficult to be transmitted to the resonator element 6 and the first circuit element 7. As a result, the temperature difference between the resonator element 6 and the temperature sensor 71 can be further reduced.

The insulating bonding member B1 is not particularly limited, and for example, various resin adhesives such as epoxy, polyimide, and silicone can be used. Such an insulating bonding member B1 has a lower thermal conductivity than a metal-based conductive bonding member typified by solder, a metal paste, and the like, and compared with the case where the first base substrate 21 and the temperature compensated crystal oscillator 3 are bonded via a conductive bonding member, the heat of the first base substrate 21 is less likely to be transmitted to the inner package 5 via the insulating bonding member B1. Therefore, the heat-insulating property of the temperature compensated crystal oscillator 3 is enhanced, and the temperature compensated crystal oscillator 3 is hardly affected by the external temperature. The heat of the second circuit element 4 is not easily transmitted to the temperature compensated crystal oscillator 3 through the first base substrate 21, thereby effectively suppressing an excessive increase in the temperature of the resonator element 6 and the first circuit element 7 in the inner package 5 and an increase in the temperature difference between the resonator element 6 and the temperature sensor 71. As a result, the temperature sensor 71 can detect the temperature of the resonator element 6 with higher accuracy, and accordingly, the temperature compensation by the oscillation circuit 72 becomes more accurate. Therefore, the oscillator 1 is capable of outputting a highly accurate frequency signal.

As shown in FIG. 2, among the four external terminals 543 included in the temperature compensated crystal oscillator 3, the terminals 543a, 543b, and 543d are electrically coupled to the internal terminal 241 via the bonding wires BW2, respectively. On the other hand, the terminal 543c is directly coupled to the second circuit element 4 through a bonding wire BW5. Thereby, the wiring length between the terminal 543c and the second circuit element 4 can be shortened. Therefore, it is difficult for noise to be added to the oscillation signal output from the oscillation circuit 72, and an accurate oscillation signal can be output to the second circuit element 4. The terminal 543a is further electrically coupled to the second circuit element 4 through a bonding wire BW6. As a result, the power supply voltage can also be supplied to the second circuit element 4.

As described above, since each external terminal 543 faces the first lid 22 side by fixing the temperature compensated crystal oscillator 3 to the first base substrate 21 with the second lid 52 facing the bottom surface of the recess portion 211*b*, connection by the bonding wires BW1, BW2, BW5, and BW6 can be easily performed.

As shown in FIG. 1, the second circuit element 4 is accommodated in the outer package 2 and is bonded to the bottom surface of the recess portion 211*c* via a bonding member B2. That is, the second circuit element 4 is disposed in the thick portion 21B of the first base substrate 21. The bonding member B2 is not particularly limited, and may be, for example, a conductive bonding member such as a metal bump, solder, a brazing material, a metal paste, a conductive resin adhesive, or may be an insulating bonding member such as a resin adhesive, but is preferably a conductive bonding member.

Since a conductive bonding member contains a metal material, the conductive bonding member has a higher thermal conductivity than an insulating bonding member that does not include a metal material typified by a resin adhesive, and the heat of the second circuit element 4 is easily transferred to the outer package 2 through the bonding member B2. Therefore, the heat of the second circuit element 4 is easily released from the outer package 2 to the outside, and excessive temperature rise of the second circuit element 4 and heat accumulation in the first internal space S2 can be suppressed. Since the heat dissipation of the second circuit element 4 is increased, the heat of the second circuit element 4 becomes difficult to be transmitted to the inner package 5, thereby more effectively suppressing an excessive increase in the temperature of the resonator element 6 and the first circuit element 7 as described above and an increase in the temperature difference between the resonator element 6 and the temperature sensor 71. As a result, the temperature sensor 71 can accurately detect the temperature of the resonator element 6, and the temperature compensation by the oscillation circuit 72 becomes more accurate. Therefore, the oscillator 1 is capable of outputting a highly accurate frequency signal.

As shown in FIG. 5, such a second circuit element 4 includes a fractional frequency division type PLL circuit 40 (phase synchronization circuit) as a frequency control circuit that controls the frequency of the oscillation signal output from the oscillation circuit 72 and further corrects the frequency temperature characteristic remaining in the oscillation signal output from the temperature compensated crystal oscillator 3, a storage unit 48 in which a temperature correction table 481 is stored, and an output circuit 49. In the embodiment, the PLL circuit 40, the storage unit 48, and the output circuit 49 are constituted as one-chip circuit elements, but may be constituted by a plurality of chip circuit elements, or a part thereof may be constituted by discrete components.

The PLL circuit 40 includes a phase comparator 41, a charge pump 42, a low-pass filter 43, a voltage-controlled oscillation circuit 44, and a frequency dividing circuit 45. The phase comparator 41 compares the phase difference between the oscillation signal output from the oscillation circuit 72 and the clock signal output from the frequency dividing circuit 45 and outputs the comparison result as a pulse voltage. The charge pump 42 converts the pulse voltage output from the phase comparator 41 into a current, and the low-pass filter 43 smoothens the current output from the charge pump 42 and converts to a voltage.

The voltage-controlled oscillation circuit 44 outputs a signal of which frequency changes according to a control voltage using the output voltage of the low-pass filter 43 as the control voltage. The voltage-controlled oscillation circuit 44 of the embodiment is an LC oscillation circuit configured by using an inductance element such as a coil and a capacitance element such as a capacitor, but is not limited thereto, and for example, an oscillation circuit using a piezoelectric resonator such as a crystal resonator can be used. The frequency dividing circuit 45 outputs a clock signal obtained by dividing the frequency of the clock signal output from the voltage-controlled oscillation circuit 44 by a fraction by a fractional ratio at a frequency dividing ratio determined from the output signal of the temperature sensor 71 and the temperature correction table 481. The frequency dividing ratio of the frequency dividing circuit 45 is not limited to the configuration determined by the temperature correction table 481. For example, the frequency dividing ratio may be determined by a polynomial operation, or may be determined by a neural network operation based on a machine learning model.

The output circuit 49 receives the clock signal output from the PLL circuit 40 and generates an oscillation signal of which amplitude is adjusted to a desired level. The oscillation signal generated by the output circuit 49 is output to the outside of the oscillator 1 via the external terminal 243 of the oscillator 1.

As described above, the frequency temperature characteristic remaining in the oscillation signal output from the temperature compensated crystal oscillator 3 is further corrected by the PLL circuit 40, whereby the oscillator 1 having a smaller frequency deviation due to temperature can be obtained. The PLL circuit 40 is not particularly limited. For example, an integer frequency division type PLL circuit that divides the oscillation signal output from the oscillation circuit 72 by an integer frequency-division ratio may be provided between the oscillation circuit 72 and the phase comparator 41. Further, the PLL circuit 40 is not limited to the circuit that further compensates the temperature of the output signal of the temperature compensated crystal oscillator 3. For example, the PLL circuit 40 may be configured to multiply the output frequency of the temperature compensated crystal oscillator 3 by a fixed value in order to obtain a desired frequency signal.

The second circuit element 4 configured as described above is arranged side by side with the temperature compensated crystal oscillator 3 in the X-axis direction in plan view. The second circuit element 4 is not in contact with the temperature compensated crystal oscillator 3. Therefore, it is difficult for the heat of the second circuit element 4 to be transmitted to the temperature compensated crystal oscillator 3, and the temperature difference between the resonator element 6 and the temperature sensor 71 due to the heat of the second circuit element 4 is effectively suppressed. Accordingly, the temperature sensor 71 can detect the temperature of the resonator element 6 with higher accuracy. In particular, in the embodiment, the second circuit element 4 includes the PLL circuit 40, and the PLL circuit 40 has a relatively large power consumption and easily generates heat. Therefore, by arranging the temperature compensated crystal oscillator 3 and the second circuit element 4 side by side in plan view, the above-described effects can be exhibited more remarkably. Since the second circuit element 4 also operates based on the temperature information signal output from the temperature sensor 71, the second circuit element 4 is less susceptible to the own heat generation thereof compared to the case where the temperature sensor 71 is provided in the second circuit element 4. The direction in which the temperature compensated crystal oscillator 3 and the second circuit element 4 are arranged in plan view is not limited to the X-axis direction, and may be, for example, the Y-axis direction or a direction inclined by a predetermined angle with respect to the X-axis direction.

In the embodiment, as described above, the thin portion 21A and the thick portion 21B of which upper surfaces are displaced in the Z-axis direction are formed on the first base substrate 21, the temperature compensated crystal oscillator 3 is disposed on the upper surface of the thin portion 21A, and the second circuit element 4 is disposed on the upper surface of the thick portion 21B. As a result, for example, compared with the case where the temperature compensated crystal oscillator 3 and the second circuit element 4 are arranged on the same plane, the heat transfer path between the second circuit element 4 and the temperature compensated crystal oscillator 3 via the first base substrate 21 can be lengthened, and the heat of the second circuit element 4 is difficult to be transmitted by the temperature compensated crystal oscillator 3. Therefore, it is possible to more effectively suppress a temperature difference between the resonator element 6 and the temperature sensor 71 due to the heat of the second circuit element 4, and the temperature of the resonator element 6 can be detected with higher accuracy by the temperature sensor 71.

In the embodiment, since a thickness t3 of the temperature compensated crystal oscillator 3 is larger than a thickness t4 of the second circuit element 4, the temperature compensated crystal oscillator 3 is disposed in the thin portion 21A, and the second circuit element 4 is disposed in the thick portion 21B. Thereby, compared with the case where arrangement is reverse, the height of the outer package 2 can be reduced. Therefore, the oscillator 1 becomes smaller.

However, the embodiment is not limited thereto. For example, the recess portion 211c may be omitted from the first base substrate 21, and the temperature compensated crystal oscillator 3 and the second circuit element 4 may be disposed on the bottom surface of the recess portion 211b. For example, contrary to the embodiment, the second circuit element 4 may be disposed in the thin portion 21A, and the temperature compensated crystal oscillator 3 may be disposed in the thick portion 21B.

As shown in FIG. 2, when a virtual center line a that bisects the outer package 2 in the X-axis direction is set, the second circuit element 4 overlaps the virtual center line a in plan view.

As shown in FIG. 2, the discrete components 81 and 82 are accommodated in the outer package 2 and are disposed on the bottom surface of the recess portion 211b. The discrete components 81 and 82 are arranged side by side with the temperature compensated crystal oscillator 3 in the Y-axis direction in plan view. One discrete component 81 is a first bypass capacitor 810, and the other discrete component 82 is a second bypass capacitor 820.

As shown in FIG. 5, the first bypass capacitor 810 is coupled to the terminal 543a between the external terminal 243 provided in the outer package 2 and the power supply voltage terminal 543a provided in the inner package 5. Thereby, noise can be removed from the power supply voltage supplied via the external terminal 243, and a stable power supply voltage can be supplied to the first circuit element 7.

On the other hand, the second bypass capacitor 820 is coupled to the terminal 543d between the terminal 543d for the output signal of the temperature sensor 71 and the PLL circuit 40. Thereby, noise can be removed from the temperature signal output from the temperature sensor 71, and a more accurate temperature signal can be supplied to the PLL circuit 40. Therefore, the frequency division ratio by the frequency dividing circuit 45 can be determined with higher accuracy.

As shown in FIG. 2, the first bypass capacitor 810 and the second bypass capacitor 820 are arranged side by side in the X-axis direction, and an end portion 811 on the plus side in the X-axis direction of the first bypass capacitor 810 and an end portion 821 on the minus side in the X-axis direction of the second bypass capacitor 820 face each other. The end portion 811 of the first bypass capacitor 810 and the end portion 821 of the second bypass capacitor 820 are both coupled to the ground. That is, the end portions 811 and 821 on the opposite sides of the first and second bypass capacitors 810 and 820 are at the same potential, particularly in the embodiment, both at the ground potential. Thereby, a short circuit between the end portions 811 and 821 is suppressed, and a highly reliable circuit can be configured. Further, the first and second bypass capacitors 810 and 820 can be disposed closer to each other, and the size of the oscillator 1 can be reduced. However, the arrangement of the first and second bypass capacitors 810 and 820 is not particularly limited. For example, the end portions 811 and 821 facing each other may have different potentials.

The discrete components 81 and 82 are not limited to the first and second bypass capacitors 810 and 820, and may be a thermistor, a resistor, a diode, or the like, for example. At least one of the discrete components 81 and 82 may be omitted, or another component may be added.

The oscillator 1 has been described above. As described above, the oscillator 1 includes the outer package 2 as a first container having the first internal space S2 and including the first base substrate 21 and the first lid 22 bonded to the first base substrate 21, the inner package 5 as a second container accommodated in the first internal space S2 and fixed to the first base substrate 21, the resonator element 6 accommodated in the inner package 5, the temperature sensor 71 accommodated in the inner package 5, the first circuit element 7 having the oscillation circuit 72 accommodated in the inner package 5 and oscillating the resonator element 6 to generate an oscillation signal of which temperature is compensated based on a temperature detected by the temperature sensor 71, and the second circuit element 4 having the PLL circuit 40 fixed to the first base substrate 21 and controlling the frequency of the oscillation signal as a frequency control circuit. The inner package 5 and the second circuit element 4 are arranged side by side in plan view.

According to such a configuration, since both the temperature sensor 71 and the resonator element 6 are accommodated in the inner package 5, the temperature sensor 71 can be disposed in the same space as the resonator element 6 and in the vicinity of the resonator element 6. The inner package 5 and the second circuit element 4 can be arranged apart from each other by being arranged side by side in plan view, heat exchange between the inner package 5 and the second circuit element 4 is suppressed, and the temperature sensor 71 and the resonator element 6 can be suppressed from being heated unevenly by the heat of the second circuit element 4. Therefore, it is possible to effectively suppress a temperature difference between the resonator element 6 and the temperature sensor 71 or a fluctuation in the temperature difference. As a result, the temperature sensor 71 can detect the temperature of the resonator element 6 with higher accuracy, and the temperature compensation by the oscillation circuit 72 becomes more accurate. An oscillation signal with a small frequency deviation can be output from the PLL circuit 40. Therefore, the oscillator 1 is capable of outputting a highly accurate frequency signal. Since the inner package 5 and the second circuit element 4 do not overlap in the Z-axis direction, the outer package 2 can be reduced in height.

As described above, the first base substrate 21 includes a thin portion 21A that is a first portion and a thick portion 21B that is a second portion that is thicker than the thin portion 21A. The inner package 5 is fixed to one of the thin portion 21A and the thick portion 21B, and the second circuit element 4 is fixed to the other. As a result, the heat transfer path between the second circuit element 4 and the temperature compensated crystal oscillator 3 via the first base substrate 21 can be lengthened, and the heat of the second circuit element 4 is difficult to be transmitted by the temperature compensated crystal oscillator 3. Therefore, it is possible to more effectively suppress a temperature difference between the resonator element 6 and the temperature sensor 71 due to the heat of the second circuit element 4, and the temperature of the resonator element 6 can be detected with higher accuracy by the temperature sensor 71.

In particular, in the embodiment, among the inner package 5 and the second circuit element 4, the thin second circuit element 4 is fixed to the thick portion 21B, and the thick inner package 5 is fixed to the thin portion 21A. Thereby, compared with the case where arrangement is reverse, the height of the outer package 2 can be reduced. Therefore, the oscillator 1 becomes smaller.

As described above, the inner package 5 includes the terminal 543d as a temperature output terminal from which an output signal of the temperature sensor 71 is output. The terminal 543d is electrically coupled to the PLL circuit 40. Thereby, the temperature information detected by the temperature sensor 71 can be fed back to the PLL circuit 40, and a more accurate frequency signal can be output from the PLL circuit 40.

As described above, the inner package 5 includes the terminal 543a as a power supply terminal to which a power supply voltage for the oscillation circuit 72 is applied. The oscillator 1 includes the first bypass capacitor 810 accommodated in the outer package 2 and coupled to the terminal 543a. Thereby, noise can be removed by the first bypass capacitor 810, and a stable power supply voltage can be supplied to the oscillation circuit 72.

As described above, the oscillator 1 includes the first bypass capacitor 810 and the second bypass capacitor 820 that are accommodated in the outer package 2 and fixed to the first base substrate 21. One end of the first bypass capacitor 810 and one end of the second bypass capacitor 820 are disposed to face each other, and the end portions 811 and 821 on facing sides of the first bypass capacitor 810 and the second bypass capacitor 820 have the same potential. Thereby, a short circuit between the end portions 811 and 821 can be suppressed, and the first and second bypass capacitors 810 and 820 can be disposed closer to each other. Therefore, the size of the oscillator 1 can be reduced.

As described above, the inner package 5 is fixed to the first base substrate 21 via the insulating bonding member B1. The insulating bonding member B1 has a lower thermal conductivity than a metal-based conductive bonding member typified by solder, a metal paste, and the like, and compared with the case where the first base substrate 21 and the temperature compensated crystal oscillator 3 are bonded via a conductive bonding member, the heat of the first base substrate 21 is less likely to be transmitted to the inner package 5 via the insulating bonding member B1. Therefore, the heat-insulating property of the temperature compensated crystal oscillator 3 is enhanced, and the temperature compensated crystal oscillator 3 is hardly affected by the external temperature. The heat of the second circuit element 4 is not easily transmitted to the temperature compensated crystal oscillator 3 through the first base substrate 21, thereby effectively suppressing an excessive increase in the temperature of the resonator element 6 and the first circuit element 7 in the inner package 5 and an increase in the temperature difference between the resonator element 6 and the temperature sensor 71. As a result, the temperature sensor 71 can detect the temperature of the resonator element 6 with higher accuracy, and accordingly, the temperature compensation by the oscillation circuit 72 becomes more accurate. Therefore, the oscillator 1 is capable of outputting a highly accurate frequency signal.

As described above, the inner package 5 includes the first side 5a and the second side 5b closer to the second circuit element 4 than the first side 5a in plan view, and the terminal 543c as an oscillation output terminal from which an oscillation signal from the oscillation circuit 72 is output. The terminal 543c is provided at one of two corners located at both ends of the second side 5b, in the embodiment, at a corner located on the Y-axis direction plus side. According to such an arrangement, the terminal 543c can be disposed closer to the second circuit element 4, and the wiring length between the terminal 543c and the second circuit element 4 can be shortened. Therefore, it is difficult for noise to be added to the oscillation signal, and an accurate oscillation signal can be output to the second circuit element 4.

As described above, the inner package 5 includes the second base substrate 51 and the second lid 52 bonded to the second base substrate 51, and has the second internal space S5 in which the resonator element 6 and the first circuit element 7 are accommodated. The second lid 52 is fixed to the first base substrate 21. By fixing the second lid 52 to the bottom surface of the recess portion 211b in this way, for example, as compared with the case where the second base substrate 51 is fixed to the bottom surface of the recess portion 211b as in a second embodiment described later, the heat transfer path from the joint portion between the inner package 5 and the first base substrate 21 to the resonator element 6 and the first circuit element 7 can be longer. Therefore, the heat of the second circuit element 4 is difficult to be transmitted to the resonator element 6 and the first circuit element 7. As a result, the temperature difference between the resonator element 6 and the temperature sensor 71 can be further reduced.

Second Embodiment

Figure 6:
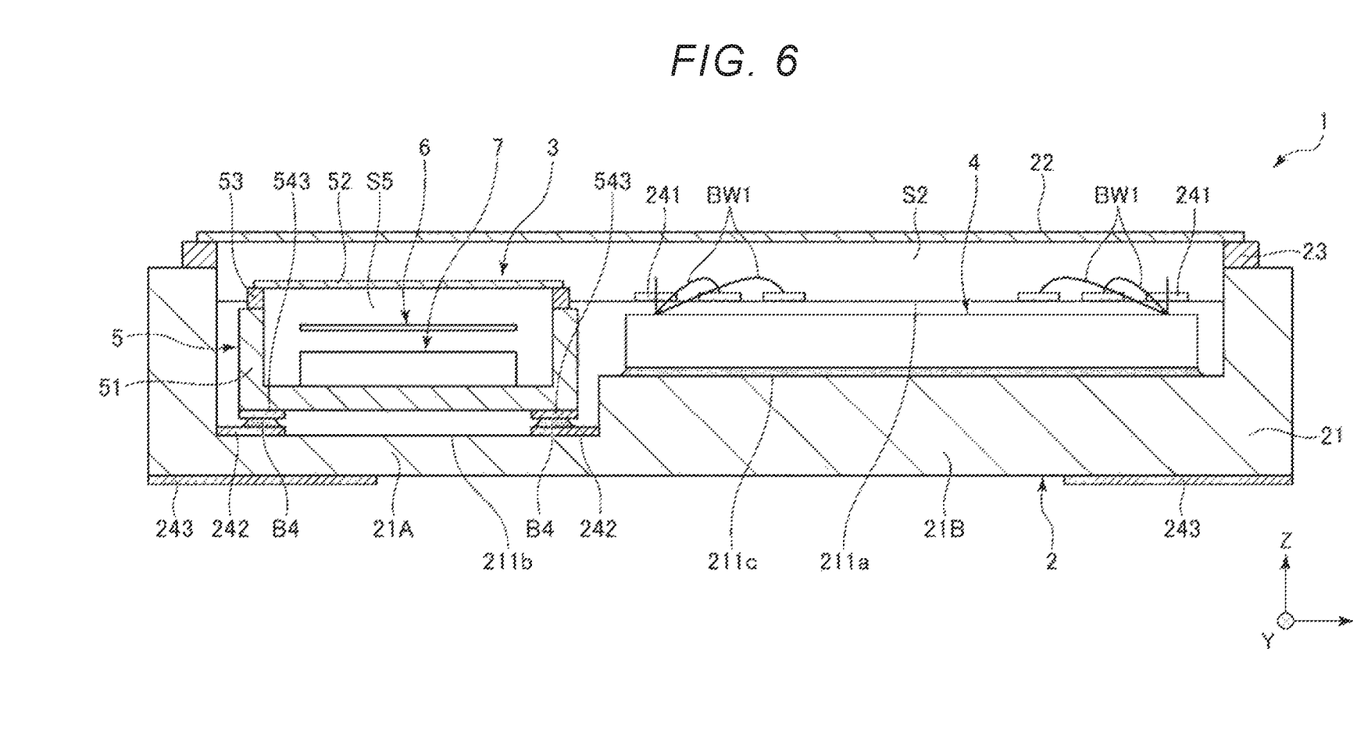
FIG. 6 is a cross-sectional view showing an oscillator according to a second embodiment.

FIG. 6 is a cross-sectional view showing an oscillator according to a second embodiment.

The embodiment is the same as the first embodiment described above except that the temperature compensated crystal oscillator 3 has a different posture. In the following description, the embodiment will be described with a focus on differences from the above-described embodiment, and the description of the same matters will be omitted. In FIG. 6, the same reference numerals are given to the same configurations as those in the above-described embodiment.

As shown in FIG. 6, in the oscillator 1 of the embodiment, a plurality of internal terminals 241 are disposed on the bottom surface of the recess portion 211a, and a plurality of internal terminals 242 are disposed on the bottom surface of the recess portion 211b. The internal terminals 241 and 242 and the external terminal 243 are electrically coupled via a wiring (not shown) formed in the first base substrate 21.

The temperature compensated crystal oscillator 3 is accommodated in the first internal space S2 in a posture opposite to the above-described first embodiment, that is, in a posture in which the second base substrate 51 faces the bottom surface side of the recess portion 211*b*. The second base substrate 51 is bonded to the bottom surface of the recess portion 211*b* via the conductive bonding member B4 made of a metal bump such as a solder bump, and each external terminal 543 is electrically coupled to the internal terminal 242. The temperature compensated crystal oscillator 3 can be mounted on the first base substrate 21 by, for example, flip chip mounting. According to such a configuration, since no bonding wire is used for the electrical connection between the temperature compensated crystal oscillator 3 and the first base substrate 21, it is not necessary to secure the loop height of the bonding wire, and accordingly, the height of the outer package 2 can be reduced as compared with the first embodiment described above.

According to the second embodiment, the same effects as those of the first embodiment described above can be exhibited.

Third Embodiment

Figure 7:
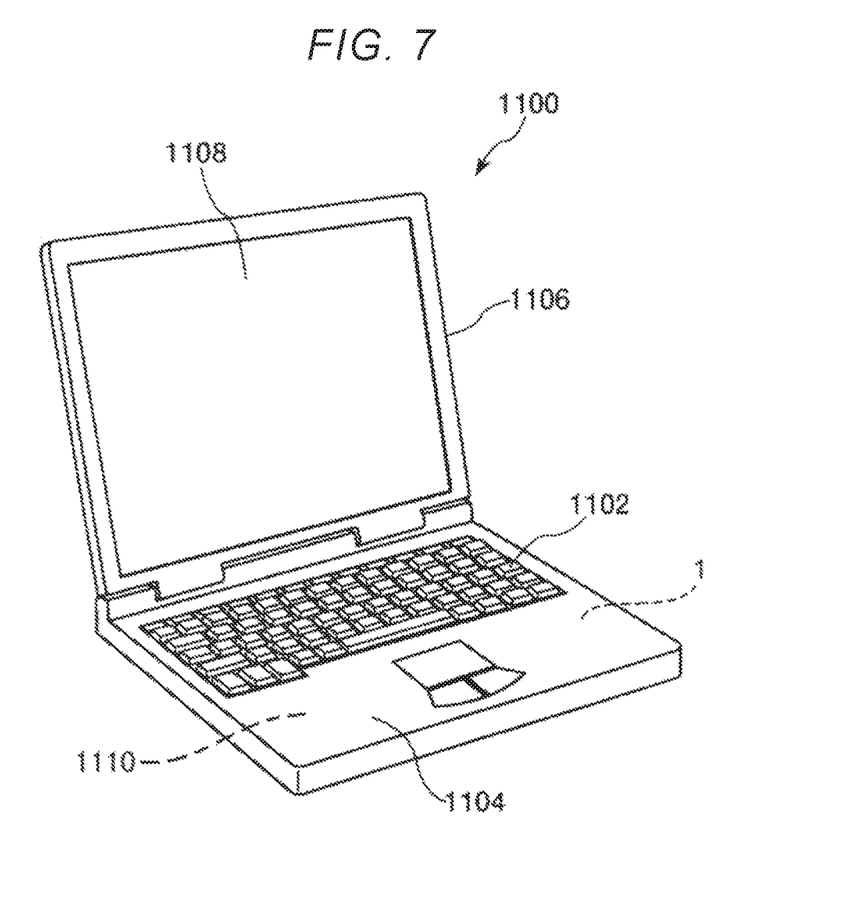
FIG. 7 is a perspective view showing a personal computer according to a third embodiment.

FIG. 7 is a perspective view showing a personal computer according to a third embodiment.

A personal computer 1100 as an electronic device shown in FIG. 7 includes a main body 1104 provided with a keyboard 1102 and a display unit 1106 provided with a display unit 1108, and the display unit 1106 is supported so as to be rotatable with respect to the main body 1104 via a hinge structure. Such a personal computer 1100 has a built-in oscillator 1. The personal computer 1100 includes a signal processing circuit 1110 that performs arithmetic processing related to control of the keyboard 1102, the display unit 1108, and the like. The signal processing circuit 1110 operates based on the oscillation signal output from the oscillator 1.

As described above, the personal computer 1100 as the electronic device includes the oscillator 1 and the signal processing circuit 1110 that performs signal processing based on the output signal (oscillation signal) of the oscillator 1. Therefore, the effect of the oscillator 1 described above can be enjoyed and high reliability can be exhibited.

In addition to the personal computer 1100 described above, an electronic device including the oscillator 1 may be, for example, digital still cameras, smartphones, tablet terminals, timepieces including a smartwatch, ink jet ejection apparatuses, such as an ink jet printer, wearable terminals such as a head mounted display (HMD), TVs, video cameras, video tape recorders, car navigation apparatuses, pagers, electronic notebooks, electronic dictionaries, calculators, electronic game machines, word processors, workstations, Video phone, TV monitors for crime prevention, electronic binoculars, POS terminals, medical equipment such as an electronic thermometer, a blood pressure monitor, a blood glucose meter, an electrocardiogram measuring apparatus, an ultrasonic diagnostic apparatus, and an electronic endoscope, fish detectors, measuring instruments, instruments such as vehicles, aircraft, ships, base stations for mobile terminals, flight simulators, and the like.

Fourth Embodiment

Figure 8:
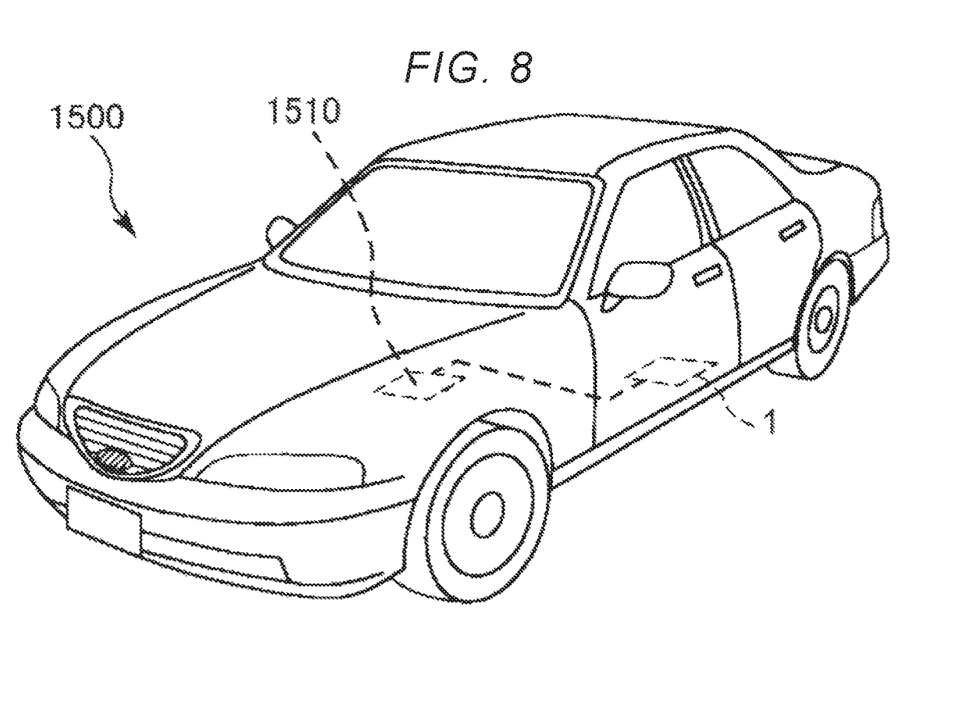
FIG. 8 is a perspective view showing an automobile according to a fourth embodiment.

FIG. 8 is a perspective view showing an automobile according to a fourth embodiment.

As shown in FIG. 8, an automobile 1500 as a vehicle includes an oscillator 1 and a signal processing circuit 1510 that operates based on an oscillation signal output from the oscillator 1. The oscillator 1 and the signal processing circuit 1510 may be widely applied to, for example, keyless entries, immobilizers, car navigation systems, car air conditioners, anti-lock brake systems (ABS), air bags, tire pressure monitoring systems (TPMS), engine controls, battery monitors for hybrid cars and electric cars, and electronic control units (ECU) such as a vehicle body attitude control system.

Thus, the automobile 1500 as a vehicle includes the oscillator 1 and the signal processing circuit 1510 that performs signal processing based on the output signal (oscillation signal) of the oscillator 1. Therefore, the effect of the oscillator 1 described above can be enjoyed and high reliability can be exhibited.

The vehicle including the oscillator 1 may be, for example, a robot, a drone, a two-wheeled vehicle, an aircraft, a ship, a train, a rocket, a spacecraft, or the like in addition to the automobile 1500.

The oscillator, the electronic device, and the vehicle according to the disclosure have been described based on the illustrated embodiments, but the disclosure is not limited thereto, and the configuration of each portion may be replaced with an arbitrary configuration having the same function. Other optional components may be added to the disclosure. Each embodiment above-described may be combined as appropriate.

What is claimed is:

1. An oscillator comprising:
   a first container that includes a first base substrate and a first lid bonded to the first base substrate and has a first internal space;
   a second container that is accommodated in the first internal space and fixed to the first base substrate;
   a resonator element that is accommodated in the second container;
   a temperature sensor that is accommodated in the second container;
   a first circuit element that is accommodated in the second container and includes an oscillation circuit oscillating the resonator element and generating an oscillation signal on which temperature compensation is performed based on a detected temperature of the temperature sensor; and
   a second circuit element that is fixed to the first base substrate and includes a frequency control circuit that controls a frequency of the oscillation signal, wherein
   the second container and the second circuit element are arranged side by side in plan view, and
   the first base substrate includes a first portion and a second portion thicker than the first portion, the second container is fixed to one of the first portion and the second portion, and the second circuit element is fixed to the other thereof.

2. The oscillator according to claim 1, wherein a thinner one of the second container and the second circuit element is fixed to the second portion, and a thicker one is fixed to the first portion.

3. The oscillator according to claim 1, wherein the second container includes a temperature output terminal from which an output signal of the temperature sensor is output, and the temperature output terminal is electrically coupled to the frequency control circuit.

4. The oscillator according to claim 1, wherein the second container includes a power supply terminal to which a power supply voltage supplied to the oscillation circuit is applied, and the oscillator further comprises a bypass capacitor that is accommodated in the first container, and is coupled to the power supply terminal.

5. An oscillator comprising:
a first container that includes a first base substrate and a first lid bonded to the first base substrate and has a first internal space;
a second container that is accommodated in the first internal space and fixed to the first base substrate;
a resonator element that is accommodated in the second container;
a temperature sensor that is accommodated in the second container;
a first circuit element that is accommodated in the second container and includes an oscillation circuit oscillating the resonator element and generating an oscillation signal on which temperature compensation is performed based on a detected temperature of the temperature sensor;
a second circuit element that is fixed to the first base substrate and includes a frequency control circuit that controls a frequency of the oscillation signal; and
a first bypass capacitor and a second bypass capacitor that are accommodated in the first container and are fixed to the first base substrate, wherein
the second container and the second circuit element are arranged side by side in plan view,
one end of the first bypass capacitor and one end of the second bypass capacitor are disposed to face each other, and
end portions on facing sides of the first bypass capacitor and the second bypass capacitor have the same potential.

6. The oscillator according to claim 1, wherein the second container is fixed to the first base substrate via an insulating bonding member.

7. The oscillator according to claim 1, wherein
the second container includes a first side and a second side closer to the second circuit element than the first side in plan view, and an oscillation output terminal from which the oscillation signal is output, and
the oscillation output terminal is provided at one of two corners located at both ends of the second side.

8. The oscillator according to claim 1, wherein
the second container includes a second base substrate and a second lid bonded to the second base substrate and has a second internal space, and
the second lid is fixed to the first base substrate.

9. An electronic device comprising:
the oscillator according to claim 1; and
a signal processing circuit that performs signal processing based on an output signal of the oscillator.

10. A vehicle comprising:
the oscillator according to claim 1; and
a signal processing circuit that performs signal processing based on an output signal of the oscillator.

* * * * *